April 24, 1962 D. R. MORRISON 3,031,550

SWITCHING ASSEMBLY

Filed Oct. 28, 1959 2 Sheets-Sheet 1

INVENTOR.
DONALD R. MORRISON
BY
Mason, Kolehmainen, Rathburn and Wyss
ATTORNEYS.

April 24, 1962 D. R. MORRISON 3,031,550

SWITCHING ASSEMBLY

Filed Oct. 28, 1959 2 Sheets-Sheet 2

INVENTOR.
DONALD R. MORRISON
BY
Mason, Kolehmainen, Rathburn and Wyss
ATTORNEYS.

United States Patent Office 3,031,550

Patented Apr. 24, 1962

3,031,550

SWITCHING ASSEMBLY

Donald R. Morrison, Chicago, Ill., assignor to C. P. Clare & Company, Chicago, Ill., a corporation of Delaware Filed Oct. 28, 1959, Ser. No. 849,279
9 Claims. (Cl. 200—87)

This invention relates to a switching assembly and, more particularly, to new and improved means for mounting and housing printed circuit panels on which electrical components are mounted.

The increased use of sealed switch units, such as "dry reed" switches and mercury contact switches, has made it necessary to provide switching assemblies including a plurality of these units and signal responsive means for operating these units either singly or in combination. In the copending application of Arthur J. Koda, Serial No. 731,390, filed April 28, 1958, which application is assigned to the same assignee as the present application, there is shown a printed circuit board carrying a plurality of sealed switch units that is mounted within a common operating winding. In certain applications, switching assemblies of this type must be mounted in metal housings. When this is done, the mounting structure must be such that the dielectric panel and the printed circuit and components carried thereon are spaced from the housing. Further, to facilitate circuit maintenance and inspection it is desirable that the printed circuit board be supported so as to permit its removal.

Accordingly, one object of the present invention is to provide a new and improved switching assembly.

Another object is to provide a switching assembly including new and improved means for supporting a printed circuit board and components mounted thereon within a housing.

A further object is to provide a switching assembly including new and improved means for securing a plurality of switch operating windings to a printed circuit panel.

A further object is to provide a switching assembly including means for holding a plurality of operating windings on a printed circuit board and for also spacing this board from the housing in which the board is mounted.

In accordance with these and many other objects, an embodiment of the present invention comprises a dielectric panel or board including a common base portion from one edge of which a plurality of narrow finger portions extend. One or both surfaces of the panel is provided with a printed circuit pattern including conductive segments extending from opposite ends of the finger portions to the opposite edge of the base portion. A plurality of sealed switch units each comprising a generally tubular or cylindrical dielectric housing from the opposite ends of which a pair of terminals extend are mounted on the finger portions of the panel with pairs of the sealed switch units positioned on opposite sides of each of the finger portions. The terminals of the sealed switch units are provided with a first portion generally coaxial with the cylindrical envelope and a second portion generally aligned with the side walls of the envelope. The second portions of the terminals engage the conductive segments in the printed circuit pattern on the panel and are connected thereto, as by soldering, to electrically and physically connect the sealed switch units to the panel.

To provide means for operating the pairs of switch units mounted on the various finger portions, an operating winding is slidably mounted on each of the finger portions to encircle or surround the two sealed switch units mounted thereon. In order to maintain the windings in this predetermined position, the free ends of the finger portions are notched to receive tongues on a locking plate that serves not only to secure the operating windings in predetermined positions, but also to space the upper end of the printed circuit panel from a protective metal housing into which the printed circuit panel and the components carried thereon are inserted. The lower end of the printed circuit panel is spaced from the housing and the lower end of the housing is closed by a generally U-shaped element having a slot in the bight portion thereof through which the lower end of the base portion of the panel extends to provide a male connector. The printed circuit panel and the elements secured thereto are detachably secured within the housing by a pair of L-shaped clips each having one leg portion received within a notch formed in the side edge of the panel and a second leg portion detachably secured to the housing.

Many other objects and advantages of the present invention will become apparent from the following detailed description thereof when considered in conjunction with the drawings in which.

Figures 1, 2, 3:
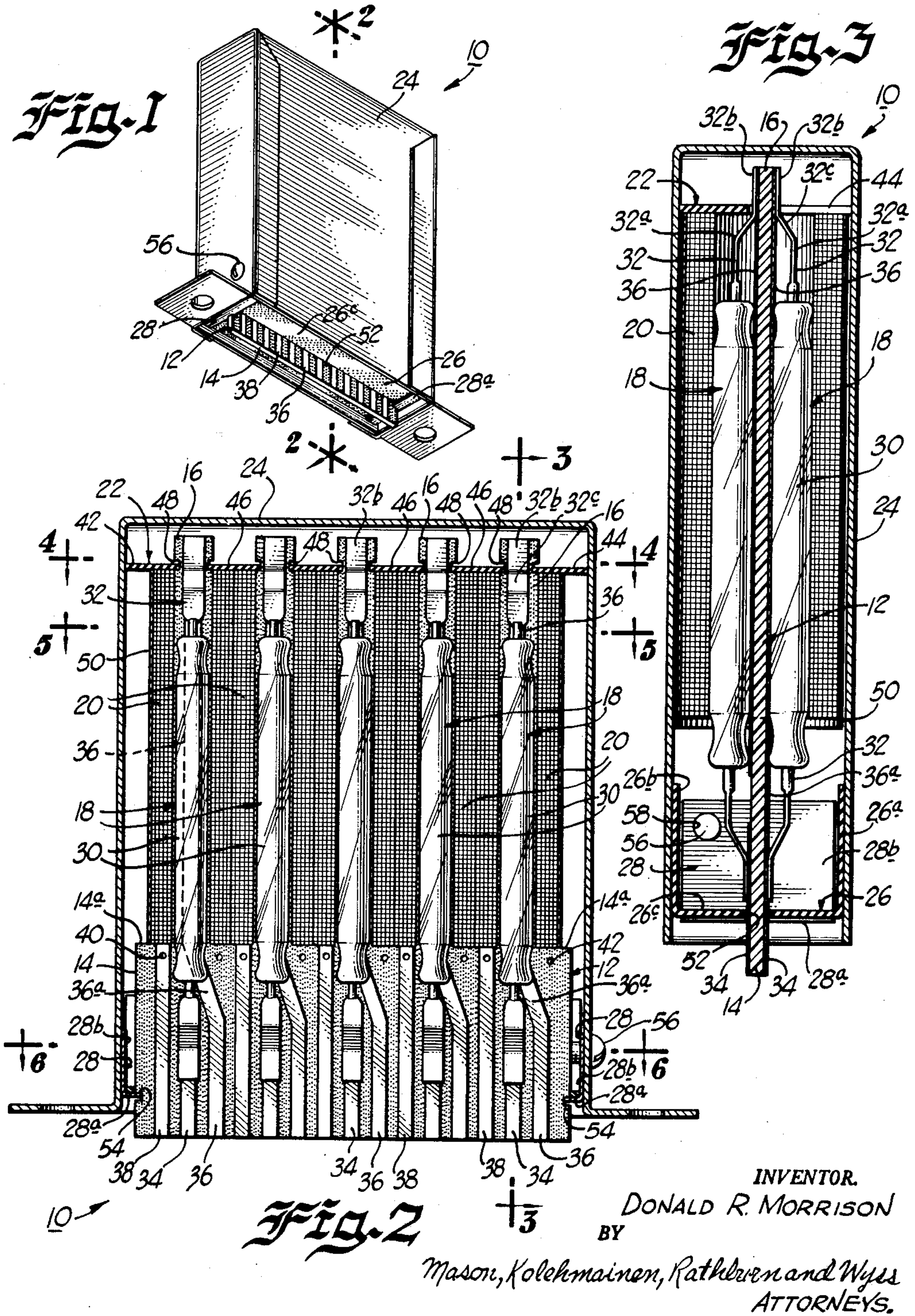
FIG. 1 is a perspective view of a switching assembly embodying the present invention.
FIG. 2 is an enlarged sectional view taken along line 2—2 in FIG. 1.
FIG. 3 is a sectional view taken along line 3—3 in FIG. 2, assuming that the entire switching assembly is shown therein.

Referring now more specifically to FIGS. 1–3 and 7 of the drawings, therein is shown a switching assembly, indicated generally as 10, which embodies the present invention and which includes a dielectric panel 12 having a common or base portion 14 and a plurality of finger portions 16 extending outwardly from an upper edge of the base portion 14. The panel 12 is provided with a printed circuit pattern comprising a plurality of electrically conductive segments secured to both sides of the panel. Two sealed switch units 18 are positioned on opposite sides of each of the finger portions 16, and the terminals of these switch units are soldered to the adjacent portions of the printed circuit pattern to electrically and mechanically connect the switch units 18 to the printed circuit board 12.

To provide means for operating the pairs of switch units 18, an operating winding 20 is mounted on each of the finger portions 16 to surround or encircle the pair of switch units 18 mounted thereon. The windings 20 are held in a proper position on the finger portions 16 by a locking plate 22 which engages the upper ends of the finger portions, the plate 22 also serving to properly locate or space the upper end of the panel 12 within the upper end of a metal housing 24 into which the panel 12 and the components mounted thereon are inserted. A generally U-shaped dielectric spacer element 26 that is slotted to receive the lower end of the panel 12 positions the lower end of this panel in a predetermined position within the housing 24. The spacer element 26 and the panel 12 are removably mounted within the housing 24 by two locking elements 28 which engage notches in the panel 12.

Referring now more specifically to the sealed switch units 18, these units can be of any of the constructions well known in the art, such as the "dry reed" relay shown and described in detail in Ellwood Patent No. 2,289,830. In general, the switch unit 18 comprises an elongated tubular or cylindrical dielectric housing 30 (FIGS. 2 and 3) containing magnetically actuated contact elements for selectively making or interrupting an electrical circuit. These contact elements are connected to a pair of terminal elements 32 that project outwardly from opposite ends of the dielectric envelope 30. In accordance with the present invention, the terminals 32 each include a first portion 32*a* that is generally aligned with the axis of the envelope 30 and a second integrally formed portion 32*b* that is generally aligned with the side wall of the envelope 30 or is spaced outwardly from the first portion 32*a* a distance substantially equal to the radius of the cylindrical envelope 30. The first and second portions 32*a* and 32*b* of the terminal 32 are interconnected by an inclined portion 32*c*. All or parts of the terminal portions 32*a*, 32*b* and 32*c* can be formed with a flat surface. By providing the second portions 32*b* on the terminals 32 that are offset from the coaxial or first portions 32*a*, the portions 32*b* will engage the printed circuit pattern when the switch units 18 are placed against the surface of the panel 12.

As indicated above, the printed circuit board or panel 12 includes the plurality of finger portions 16 on which the pairs of switch units 18 and the operating windings 20 therefor are mounted and also includes a printed circuit pattern for connecting these components to the panel 12. In general, the printed circuit pattern that is provided on both surfaces of the dielectric board 12 includes a plurality of discrete electrically conductive or metal foil segments that extend from various positions on the board 12 to the lower edge of the base portion 14. The lower edge of the base portion 14 projects outwardly from the housing 24 to provide a male electrical connector for interconnecting the switching assembly 10 with external circuits. The printed circuit can be formed on the panel 12 by any of the methods well known in the art.

Figures 4, 5, 6, 7:
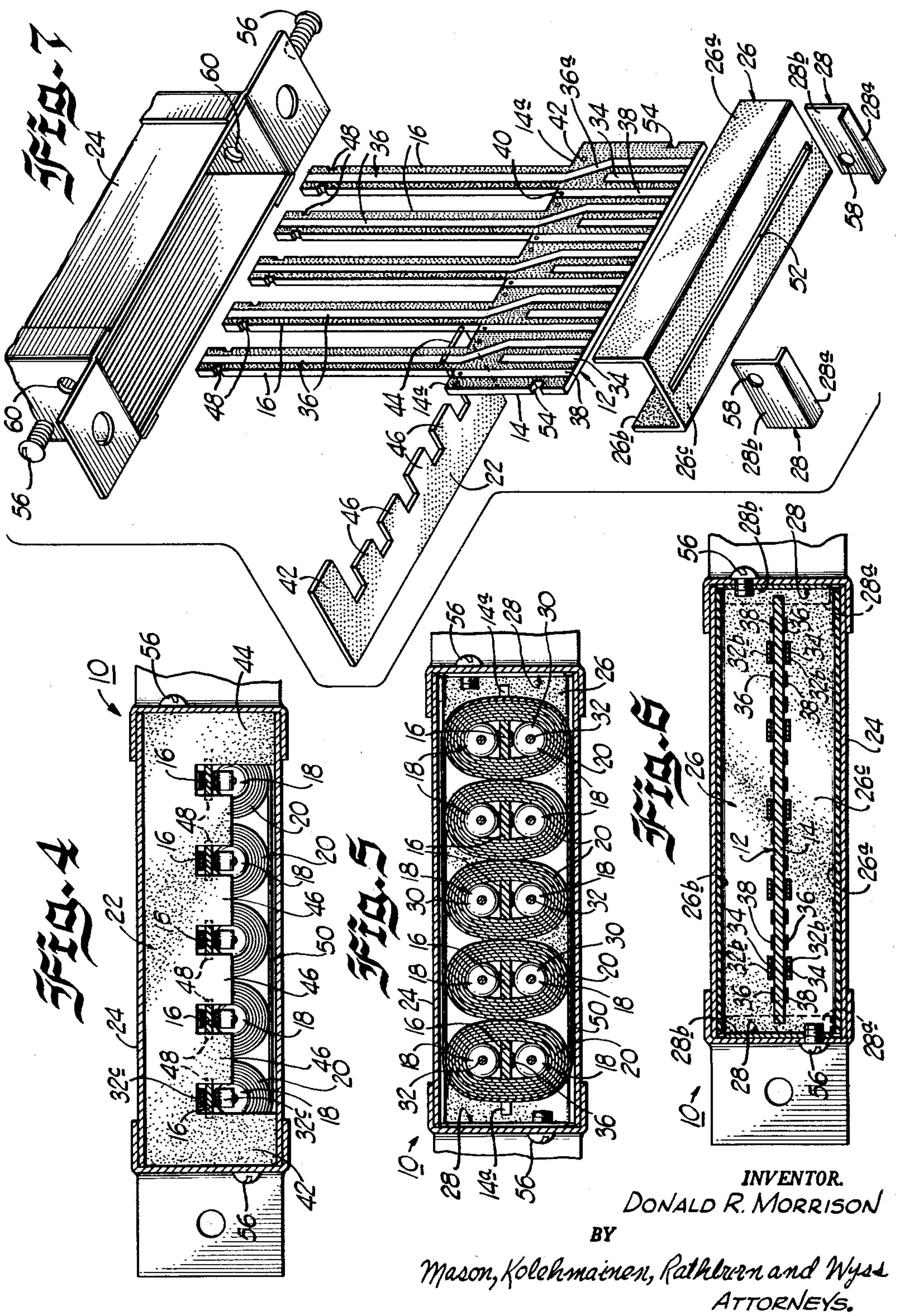
FIG. 4 is a sectional view taken along line 4—4 in FIG. 2, again assuming that the complete construction is illustrated therein.
FIG. 5 is a sectional view taken along line 5—5 in FIG. 2, assuming that the entire construction is shown therein.
FIG. 6 is a sectional view taken along line 6—6 in FIG. 2, again assuming that the complete construction is illustrated therein.
FIG. 7 is an exploded perspective view of the relay construction with the sealed switch units and operating windings therefor removed.

The surface of the panel 12 shown in FIG. 2 of the drawings includes a plurality of conductive segments 34, each of which extend from the lower edge of the base portion 14 to a point adjacent the lower end of one of the finger portions 16. The board 12 is also provided with a plurality of conductive segments 36 that extend from the lower edge of the base portion 14 to the upper ends of the finger portions 16, the segments 36 each being provided with an offset intermediate portion 36*a* that permits the upper end of the segment 36 to be aligned with the related segment 34. In addition, the panel 12 includes a plurality of segments 38 for providing electrical connections to the windings 20. The printed circuit pattern provided by the segments 34, 36 and 38 on the reverse side of the board 12 is similar to that illustrated in FIG. 2. More specifically, the reverse side of the base portion 14 of the board 12 is provided with conductive segments identical to the segments 34 which are disposed directly behind the illustrated segments 34. The segments 38 on the reverse side of the board 12 underlie the lower ends of the segments 36 shown in FIG. 2, and the lower ends of the segments 36 on the reverse side of the board 12 are behind the segments 38 illustrated in FIG. 2. This relative disposition of the segments 34, 36 and 38 is indicated in FIG. 6 of the drawings.

When the switching assembly 10 is to be assembled, the sealed switch units 18 are positioned on the opposite sides of the finger portions 16 with the end portions 32*b* of the terminals 32 engaging the upper ends of the segments 34 and 36. These terminals are then soldered to the engaged portions of the conductive segments 34 and 36 to electrically and mechanically mount the switch units 18 on both sides of the printed circuit board 12. Because of the provision of the offset end portions 32*b* of the terminals 32 on the switch units 18, the sealed switch units 18 can be mounted against the opposite sides of the dielectric panel 12 merely by soldering the terminals 32 to the adjacent portions of the printed circuit pattern and without requiring the formation of either enlarged or recessed areas on the panel 12 or the use of special connectors or terminal adaptors.

After the pairs of switch units 18 are mounted on the finger portions 16, a coil or winding 20 is placed over each of the finger portions 16 to encircle or surround the two switch units 18 mounted thereon. The coil 20 is so mounted that the lower edge thereof engages or rests on an upper edge 14*a* of the base portion 14. In order to electrically interconnect the windings 20 with the printed circuit pattern on the board 12, the free end of one of the leads to each of these windings is inserted through an opening 40 from the back surface of the board 12 to the front surface thereof and is soldered to the upper end of one of the conductive segments 38 (FIG. 2). The free end of the other lead for each of the windings 20 is inserted downwardly (FIG. 2) through a plurality of holes 42 to be soldered to one of the segments 38 secured to the back surface of the panel 12. Thus, the windings 20 are electrically connected to the printed circuit pattern on the board 12.

To provide new and improved means for securing the windings 20 in their proper positions on the finger portions 16 and in order to space the upper end of the panel 12 from the housing 24, the locking plate 22 is provided. This plate (FIGS. 2, 4 and 7) includes two end portions 42 and 44 of a length approximately equal to the width of the housing 24. The plate 22 also includes a plurality of shorter tongue portions 46, the edges of which are received in notches 48 formed in opposite edges of the upper ends of the finger portions 16. The tongues 46 are interposed between the finger portions 16 so as to maintain them in a proper spaced position and overlie the upper ends of the windings 20 to hold them in engagement with the upper edge 14*a* of the base portion 14 of the printed circuit panel 12. To insulate the windings 20 from contact with the housing 24, a layer 50 of dielectric material is wrapped around these windings. The dielectric layer 50 also aids in maintaining these windings in a proper position on the panel 12.

When the printed circuit panel 12 and the components mounted thereon are inserted into the open lower end of the housing 24, the end portions 42 and 44 of the locking plate 22 correctly position the board 12 relative to the front and back walls of the housing. The length of the locking plate 22 is such that the board 12 is located in a correct position relative to the side walls of the housing 24. To provide a means for insulating and suitably spacing the lower end or base portion 14 of the panel 12 from the housing 24, the U-shaped spacer element 26 is provided. The element 26 includes a pair of leg portions 26*a* and 26*b*, which slidably engage the front and back walls of the housing 24, and a bight portion 26*c* defining a slot 52 through which the lower end of the panel 12 extends. Thus, the spacer element 26 centers the panel 12 relative to the side and the front and back walls of the housing 24 and electrically insulates the printed circuit pattern and the terminals 32 from inadvertent contact with the walls of the housing.

To provide a means for detachably securing the panel 12 within the housing 24 and to provide means for holding the spacer element 26 in position, the pair of L-shaped locking elements 28 is provided. Each of these elements includes a horizontally extending leg 28*a* that is received within a notch 54 formed in the side edge of the base portion 14 of the panel 12 and a vertically extending leg 28*b* that is detachably secured to the side wall of the housing 24 by a machine screw 56. When the panel 12 is to be inserted into the open end of the housing 24, the spacer element 26 is slipped over the lower end of the base portion 14 and the ends of the horizontal legs 28*a* on the locking elements 28 are inserted into the notches 54. The panel 12 is then advanced into the housing 24 until a pair of openings 58 (FIGS. 3 and 7) in the vertical legs 28*b* of the locking elements 28 move into alignment with a pair of openings 60 (FIG. 7) in the side walls of the housing 24. The machine screws 56 are then threaded into the aligned openings 58 and 60 to secure the locking elements 28 in place. Thus, the printed circuit panel 12 and the components mounted thereon are correctly positioned within and insulated from contact with the housing 24. As illustrated in FIGS. 2 and 3 of the drawings, the lower edge or end of the base portion 14 to which the ends of the segments 34, 36 and 38 extend projects downwardly below the lower end of the housing 24 to provide a male connector element by which the switch units 18 and the operating windings 20 are connected to external circuits.

Although the present invention has been described with reference to a single embodiment thereof, it should be understood that numerous other modifications and embodiments can be devised by those skilled in the art that will fall within the spirit and scope of the principles of this invention.

What is claimed and desired to be secured by Letters Patent of the United States is:

1. A switching assembly comprising a dielectric panel having a plurality of spaced projecting portions, a switch unit mounted on each of said projecting portions, a winding mounted on each of said projecting portions and at least partially surrounding the switch unit mounted thereon, and locking means carried on the outer free ends of said projecting portions and extending over said windings to hold said windings in position on said projecting portions.

2. A switching assembly comprising a uniplanar dielectric panel having a plurality of spaced portions projecting outwardly from one edge thereof, the outer ends of said spaced portions having shoulders formed therein, a plurality of sealed switch units carried on said spaced portions, an operating winding slidably mounted on each of said spaced portions, and a locking plate carried on and extending transverse to said spaced portions for holding said operating windings on said spaced portions, said locking plate including a plurality of spaced projections slidably engaging said shoulders and each extending between adjacent spaced portions.

3. The switching assembly set forth in claim 2 including a housing defining an opening of two mutually perpendicular dimensions, said panel being mounted in said housing, said locking plate including two opposite end portions of a length substantially equal to one of said two mutually perpendicular dimensions for positioning said panel within said housing.

4. The switching assembly set forth in claim 3 in which said locking plate includes a portion having a length substantially equal to the other of said mutually perpendicular dimensions.

5. A switching assembly comprising a generally rectangular housing having an open end, a uniplanar dielectric panel adapted to support a plurality of electrical components and including a pair of shouldered portions formed in its side edges, said panel being disposed in said housing with said shouldered portions positioned adjacent said open end, first and second dielectric elements carried on spaced portions of said panel and extending transverse thereto for spacing said panel from said housing, and a pair of locking elements removably mounted on said housing and including a pair of projecting portions engaging said shouldered portions to detachably mount said panel within said housing, said pair of locking elements also engaging one of said first and second dielectric elements to retain said one dielectric element in said housing.

6. A printed circuit board assembly comprising a generally rectangular housing including a pair of side walls, a front wall, back wall, and a top wall, said walls defining a lower open end for said housing; a uniplanar printed circuit panel having a pair of shouldered portions located in a pair of its opposite side edges; spacing means carried on said panel and engaging the inner surfaces of said front, back and side walls to position said panel within said housing in a position parallel to and spaced from said front and back walls and transverse to and spaced from said side walls, said shouldered portions being positioned adjacent said side walls near said open end of the housing; and a pair of locking means carried on the side walls of said housing and engaging said shouldered portions on said panel for holding said panel within said housing.

7. The printed circuit board assembly set forth in claim 6 in which each of said pair of locking means includes an L-shaped element with one leg secured to said side wall and another leg engaging said shouldered portion.

8. The printed circuit board assembly set forth in claim 6 in which an end of said panel projects outwardly from said open end of said housing, in which conductive segments are secured to said panel and extend to said end of said panel to provide an electrical connector for said panel, and in which said locking means engage said shoulder portions at positions spaced inwardly from said end of said panel.

9. The printed circuit board assembly set forth in claim 6 in which said spacing means includes a dielectric element slidably mounted on said panel and engaging said pair of locking means.

References Cited in the file of this patent

UNITED STATES PATENTS

| | | |
|---|---|---|
| 2,630,506 | Buch | Mar. 3, 1953 |
| 2,823,360 | Jones | Feb. 11, 1958 |
| 2,850,681 | Horton | Sept. 2, 1958 |
| 2,889,424 | Glore | June 2, 1959 |
| 2,906,838 | Deighton | Sept. 29, 1959 |